United States Patent

Semba et al.

[11] Patent Number: 6,063,439
[45] Date of Patent: May 16, 2000

[54] PROCESSING APPARATUS AND METHOD USING SOLUTION

[75] Inventors: Norio Semba, Kumamoto-ken; Junichi Kitano; Takayuki Katano, both of Yamanashi-ken, all of Japan

[73] Assignee: Tokyo Electron Limited, Tokyo, Japan

[21] Appl. No.: 09/090,882

[22] Filed: Jun. 5, 1998

[30] Foreign Application Priority Data

Jun. 11, 1997 [JP] Japan .................................... 9-169552

[51] Int. Cl.⁷ .............................. B05D 3/12; B05C 11/02
[52] U.S. Cl. ...................... 427/240; 118/52; 118/602; 118/603; 427/345; 427/385.5; 437/231
[58] Field of Search .............................. 427/240, 385.5, 427/345; 118/52, 602, 603; 437/231

[56] References Cited

U.S. PATENT DOCUMENTS 5,945,161  8/1999  Hashimoto et al. ................. 427/240

FOREIGN PATENT DOCUMENTS

8-97134   4/1996  Japan .
9-205062  8/1997  Japan .
2759654   3/1998  Japan .

Primary Examiner—Janyce Bell
Attorney, Agent, or Firm—Foley & Lardner

[57] ABSTRACT

A processing apparatus using solution comprises a rotary table which rotates while holding a substrate thereon, in the processing chamber provided in the casing, a supply mechanism for supplying a processing solution to a surface of the substrate held on the rotary table, and an impurity remover unit, provided outside the casing, wherein the impurity remover unit includes a cleaning unit for cleaning an object gas introduced from the inlet opening by brining it into contact with an impurity remover solution, and the gas-liquid separation mechanism for separating liquid from gas in an exhaust is provided in the exhaust system for exhausting the casing.

17 Claims, 6 Drawing Sheets

PROCESSING APPARATUS AND METHOD USING SOLUTION

BACKGROUND OF THE INVENTION

The present invention relates to a processing apparatus and method for performing a process by supplying a processing solution onto a substrate.

In a photoresist processing step of a semiconductor manufacturing process, resist solution is first applied on a surface of a substrate, such as a semiconductor wafer (hereinafter referred to as a wafer), thereby forming a resist film thereon, the resist film on the wafer is exposed with a predetermined pattern and thereafter subjected to development processing by use of a developer solution. Conventionally, a coating/developing system has been used to perform the aforementioned series of processes.

In general, the coating/developing system has a plurality of processing units. The processing units include, for example, an adhesion processing unit for improving the adhesion of resist to the wafer, a resist coating unit for coating the wafer with the resist solution, a thermal processing unit for subjecting the wafer coated with the resist solution to an atmosphere of a predetermined temperature to harden the resist, a thermal processing unit for subjecting the exposed wafer to an atmosphere of a predetermined temperature, and a developer unit for developing the exposed wafer with a developer solution. The wafer is transferred by a transfer mechanism, such as a transfer arm, to be loaded to or unloaded from these processing units, where the respective processes are carried out one after another in the order.

Each of the resist coating unit and the developer unit has a processing chamber called cup in the interior, and the wafer is placed on a rotary table rotatably provided in the processing chamber. In order to carry out the resist coating or developing process, a resist solution or developer solution is supplied onto the wafer from a feeder mechanism such as a nozzle, situated above the wafer, and the wafer is rotated so as to diffuse the resist solution or developer solution on the wafer. During this operation, the resist solution or developer solution may scatter to the periphery, and therefore the processing chamber is surrounded by an appropriate casing. Further, since the exhaust from the resist coating unit or developer unit having the above-described structure contains organic solvent, conventionally, the entire amount of the exhaust is discarded to the central exhaust system of the factory.

However, when the entire amount of the exhaust from the resist coating unit or developer unit is discharged to the central exhaust system of the factory as in the conventional case, the load on the factory exhaust system is increased as the amount of wafers processed is increased, and further the facilities for the operation becomes large in size accordingly. Further, an increase in the number of times of maintenance is inevitable, and naturally the maintenance cost is increased. Furthermore, a separate air supply source for replenishing air by the amount discarded to the central exhaust system of the factory must be provided.

BRIEF SUMMARY OF THE INVENTION

The object of the present invention is to provide a processing apparatus and method using solution, which is capable of cleaning the atmospheres in the processing units such as the resist coating unit and developer unit, by means of a separate impurity remover machine, so as to recycle the atmosphere in the circulation, without discarding the entire amount of the atmosphere in these units to the central exhaust system of the factory.

According to the present invention, there is provided a processing apparatus including a casing in which at least one processing chamber is provided, a rotary table which rotates while holding a substrate thereon, in the processing chamber provided in the casing, a supply mechanism for supplying a processing solution to a surface of the substrate held on the rotary table, a gas-liquid separation mechanism, provided in an exhaustion system for exhausting the casing, for separating liquid in an exhaust from gas, and an impurity remover unit, coupled to the casing, for cleaning unclean gas in the casing, wherein the impurity remover unit further comprises a gas inlet opening connected to a gas exit of the gas-liquid separation mechanism, a cleaning unit for cleaning an object gas introduced from the inlet opening by brining it into contact with an impurity remover solution, and a gas supplying unit for supplying thus cleaned gas into the casing.

Further, according to the present invention, there is further provided a processing method using solution comprising the steps of supplying a processing solution onto a surface of a substrate being rotated while holding the substrate in a processing chamber provided in a casing, separating liquid and gas of an exhaust in the casing, cleaning the separated gas by bringing it into contact with an impurity remover solution, and returning the cleaned gas into the casing.

With the present invention, it becomes possible to recycle the exhaust from the casing by cleaning it through the impurity remover unit, without discarding the entire amount of the exhaust from the casing to the factory exhaust system. Therefore, the load on the factory exhaust system can be reduced, and at the same time, the amount of new air supplied from outside can be decreased.

Further, the atmosphere within the casing of the solution processing apparatus is first subjected to the gas-liquid separation by the gas-liquid separator section provided in the exhaust system for the atmosphere, and only the gas portion is introduced to the impurity remover unit, the load on the impurity remover unit can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

An embodiment of the present invention will now be described with reference to accompanying drawings.

Figure 1:
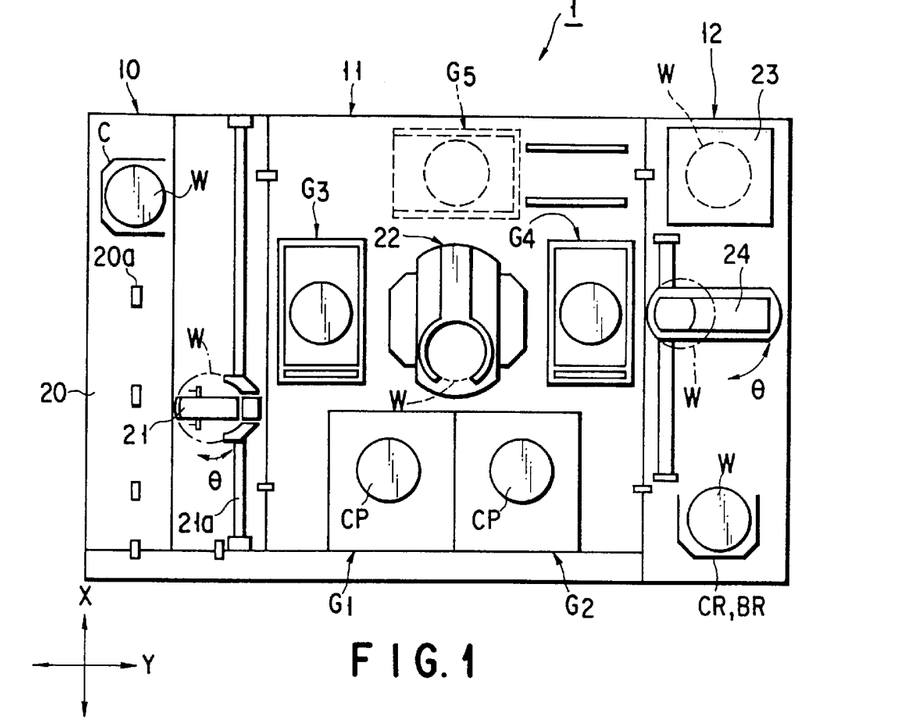
FIG. 1 is a plan view of a coating/development system equipped with a resist solution coating unit according to an embodiment of the present invention.

As shown in FIG. 1, an coating/development processing system 1 includes resist solution coating units $COT_1$ and $COT_2$, and developer units $DEV_1$ and $DEV_2$, serving as a processing apparatus using solution according to this embodiment, which will be explained later.

The coating/development processing system 1 includes a cassette station 10 for loading/unloading cassettes C each containing a plurality of wafers W, for example, in the unit of 25, to/from the system, a processing station 11 including various types of processing units each placed at a respective predetermined location of a multi-level arrangement step, and each device carrying out a predetermined process on wafers W one by one in the coating/development processing step, and an interface unit 12 for passing or receiving wafers W between an exposure processing device (not shown) provided adjacent to the processing station 11, and the processing station, all of which are connected to each other as an integral unit.

As shown in FIG. 1, in the cassette station 10, a plurality of, e.g., four, cassettes C are placed at the positions of aligning projections 20a on a cassette table 20 serving as a table, such that the wafer entrances of the cassettes are arranged to face the processing station 11 in one row. A wafer conveying member 21 which is movable in the direction of arrangement of cassettes (that is, X direction: up-and-down direction in the figure) and in the direction of arrangement of wafers W contained in a cassette C (that is, Z direction: vertical direction), can move along a conveying path 21a, and thus access selectively to each of cassettes C. The wafer conveying member 21 is rotatable in the θ direction, and therefore able to access to an alignment unit ALIM and an extension unit EXT, which belong to a multi-level unit section of the third processing unit group $G_3$ on the processing station 11 side, which will be explained later.

As shown in FIG. 1, in the processing station 11, a main wafer transfer machine 22 of a vertical transfer type is provided at a central section, and various types of processing units are provided to constitute a processing unit group, around the processing station 11 to be arranged as one unit or a plurality of units in an multi-level integration manner. The application/development processing system 1 has a structure in which five processing unit groups $G_1$, $G_2$, $G_3$, $G_4$ and $G_5$ can be arranged, the first and second processing unit groups $G_1$ and $G_2$, being situated on the front side of the system, the third processing unit group $G_3$ situated adjacent to the cassette station 10, the fourth processing unit group $G_4$ situated adjacent to the interface unit 12, and the fifth processing unit group $G_5$ illustrated by broken line, which can be situated, for example, on the back side of the system.

Figure 2:
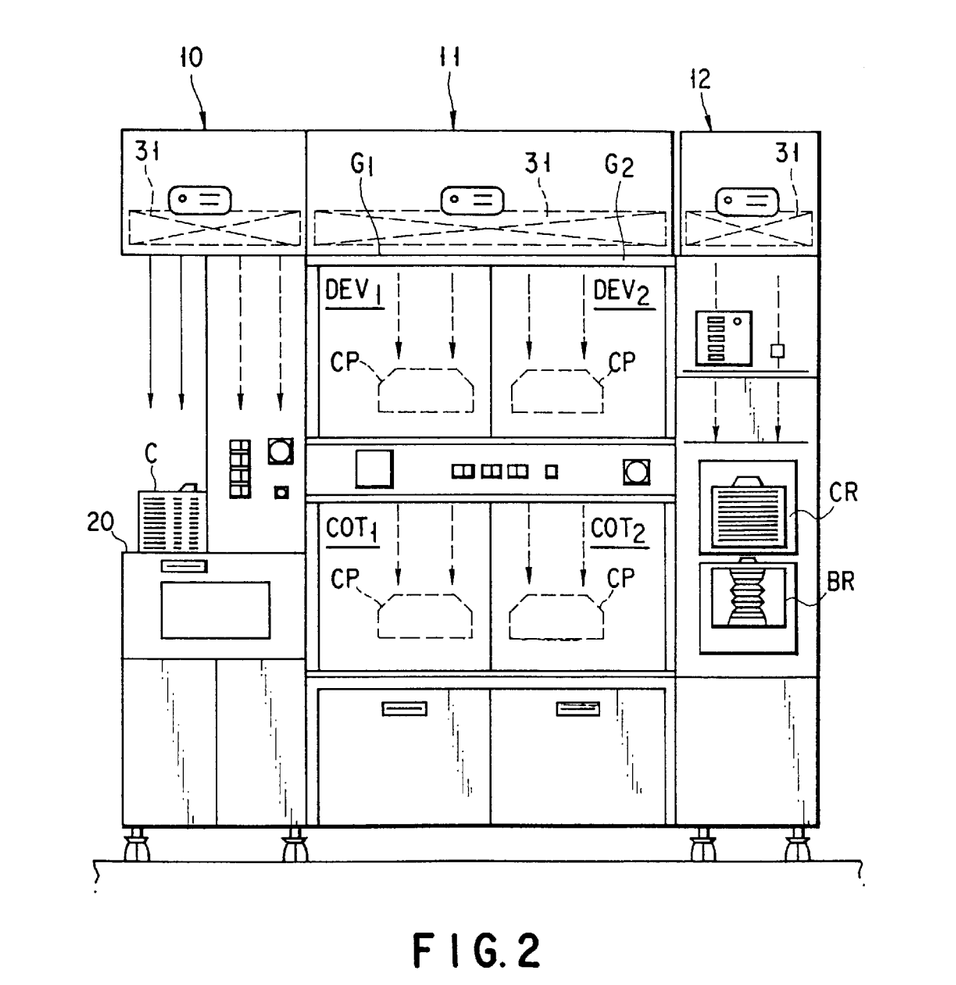
FIG. 2 is a front view of the coating/development system shown in FIG. 1.

As can be seen in FIG. 2, the first processing unit group $G_1$ includes a resist solution coating unit $COT_1$ and a developer unit $DEV_1$, according to this embodiment, situated one above the other in two levels in the order from below, which carries out a predetermined solution process on wafers W in a processing chamber CP. In a similar manner, the second processing unit group $G_2$ includes a spinner type processing unit serving as a solution processing unit, that is, a resist solution coating unit $COT_2$ and a developer unit $DEV_2$ situated one above the other in two levels in the order from below. The resist solution coating unit $COT_2$ and the developer unit $DEV_2$ of the second processing unit group $G_2$ are similar to the resist solution coating unit $COT_1$ and the developer unit $DEV_1$ in structure and function, and therefore the explanations for only the resist solution coating unit $COT_1$ and the developer unit $DEV_1$ will be provided.

Figure 3:
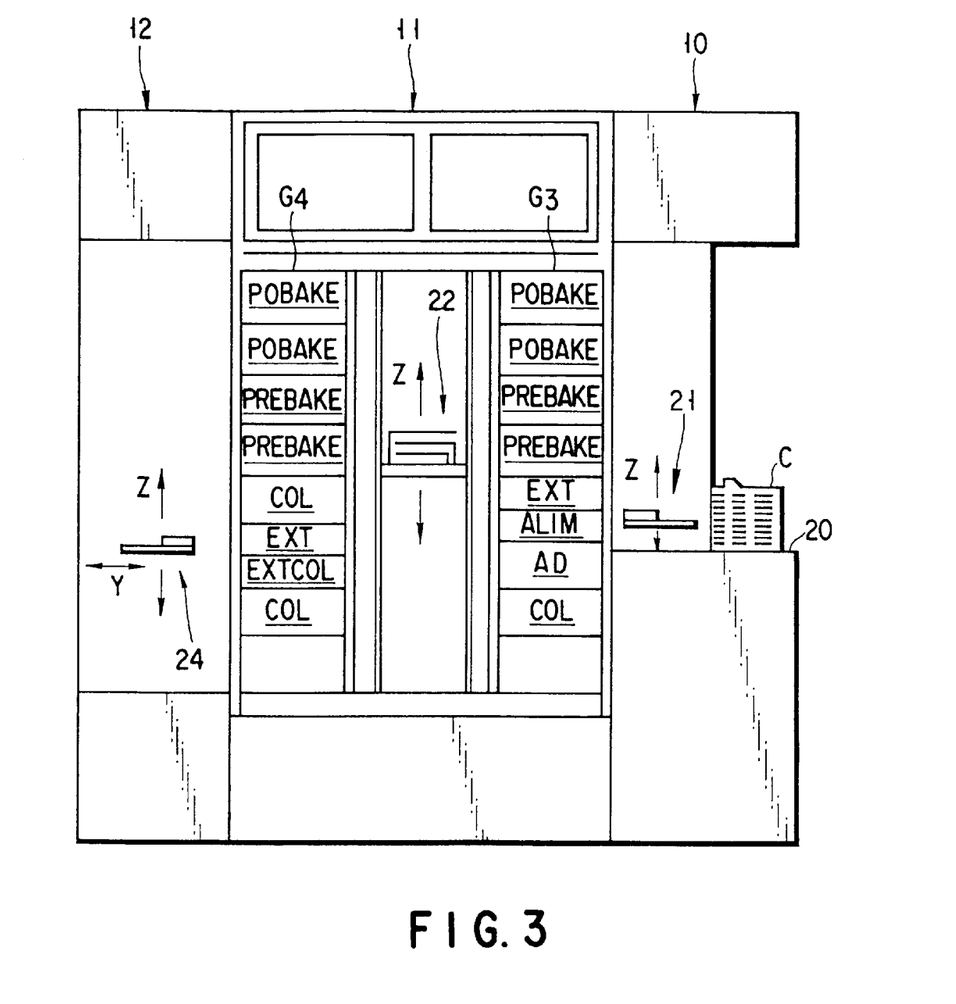
FIG. 3 is a rear view of the coating/development system shown in FIG. 1.

As can be seen in FIG. 3, the third processing unit group $G_3$ includes open type processing units for carrying out a predetermined process on wafers W on a table (not shown), a cooling unit COL for carrying out, for example, a cooling process, an adhesion unit AD for carrying out an adhesion processing, an alignment unit ALIM for carrying out an alignment, an extension unit EXT, a pre-baking unit PREBAKE for carrying out a heating process before an exposure process, and a post baking unit POBAKE for carrying out a heating process after the exposure process, situated one above another in eight levels in the order from below. Similarly, the fourth processing unit group $G_4$ includes open type processing units, a cooling unit COL, an extension/cooling unit EXTCOL, a pre-baking unit PREBAKE, and a post baking unit POBAKE, situated one above another in, for example, eight levels in the order from below.

As shown in FIGS. 1 and 2, a portable pick up cassette CR and a fixed type buffer cassette BR are provided in two levels in the front side of the interface unit 12, and an optical edge bead remover 23 is provided in the rear side of the interface unit 12. Further, a wafer transfer arm 24 is provided at the center portion of the interface unit 12. The wafer transfer arm 23 can move in the X direction and Z direction (vertical direction), and therefore access to both of the cassettes CR and BR, and the optical edge bead remover 23. Further, the wafer transfer arm 24 is formed such as to be rotatable in the θ direction and movable in the Y direction, and therefore it is able to access to the extension unit EXT which belongs to the fourth processing unit group $G_4$ situated on the processing station 11 side, and a wafer receiving table of the exposure processing unit (not shown) adjacent to the extension unit.

In the coating/development processing system 1, a high-performance filter 31 such as an ultra particle filter (ULPA filter) is provided in the upper section of the system for each of there zones (namely, the cassette station 10, the processing station 11 and the interface unit 12), as shown in FIG. 2, so as to create a down-flow of clean air from above onto the cassette table 20, a transfer path 21a for the wafer transfer arm 21, the first to fifth processing unit groups $G_1$, $G_2$, $G_3$, $G_4$ and $G_1$, and the interface unit 12. The air supplied from the upstream side of each high-performance filter 31 is cleaned as it passes through the high-performance filter 31, and therefore a down-flow of clean air can be created as shown in FIG. 2 with a solid-line arrow and a broken-line arrow. Further, with respect to the resist solution coating unit $COT_1$ and the developer unit $DEV_1$ in particular, a duct pipe is provided appropriately as shown in FIG. 4 such that another down-flow of clean air is created independently for the internal structures of these units.

Figure 4:
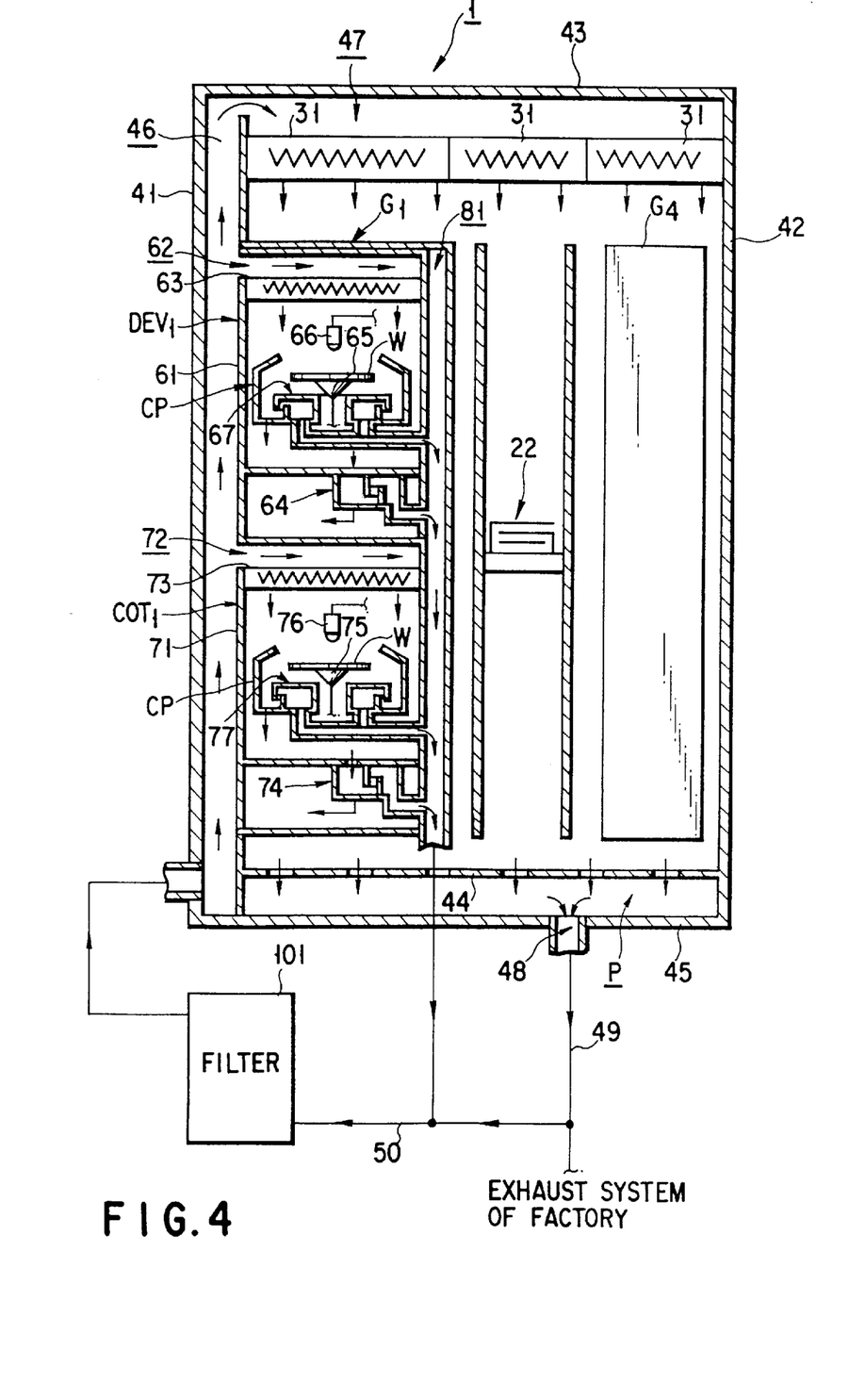
FIG. 4 is a schematic cross sectional view showing the inside of the coating/development system shown in FIG. 1.

The coating/development processing system 1 is enclosed by side panels 41 and 42 as shown in FIG. 4. The top of the processing system 1 is covered by a top panel 43, and a bottom panel 45 is provided for the bottom portion of the processing system 1 via a gap P between a ventilation plate 44 and the bottom plate 45 itself. A wall duct 46 is formed on one side of the system, so as to communicate to a ceiling chamber 47 formed on the lower surface side of the top plate 43.

An exhaust hole 48 is made in the bottom panel 45, and with this structure, the atmospheric gas in the lower side in the system, collected via the ventilation plate 44 is exhausted to the central exhaust system of the factory via an exhaust pipe 49 connected to the exhaust hole 48, but part of the gas is introduced to a filter mechanism 101 serving as an impurity remover unit. The air cleaned by the filter mechanism 101 is sent out to the wall duct 46 via a transmission tube 51, and is blown out as a down-flow into the system via the high-performance filter 31 provided underneath the ceiling chamber 47.

With regard to the developer unit $DEV_1$ in the first processing unit group $G_1$ provided in the coating/development processing system 1, a separate sub-chamber 62 is formed at an upper section of the inner side of the casing 61 which constitutes the outer wall. The sub-chamber 62 is made to communicate to the wall duct 46 of the system. Therefore, the already cleaned air which flows through the wall duct 46 is discharged into the casing 61 as a down-flow, via the high-performance filter 63 provided underneath the sub-chamber 62. Alternatively, it is possible to constitute a structure in which the down-flow of air is introduced from the ceiling chamber 47 into the casing 61 without preparing a sub-chamber 61.

Figure 5:
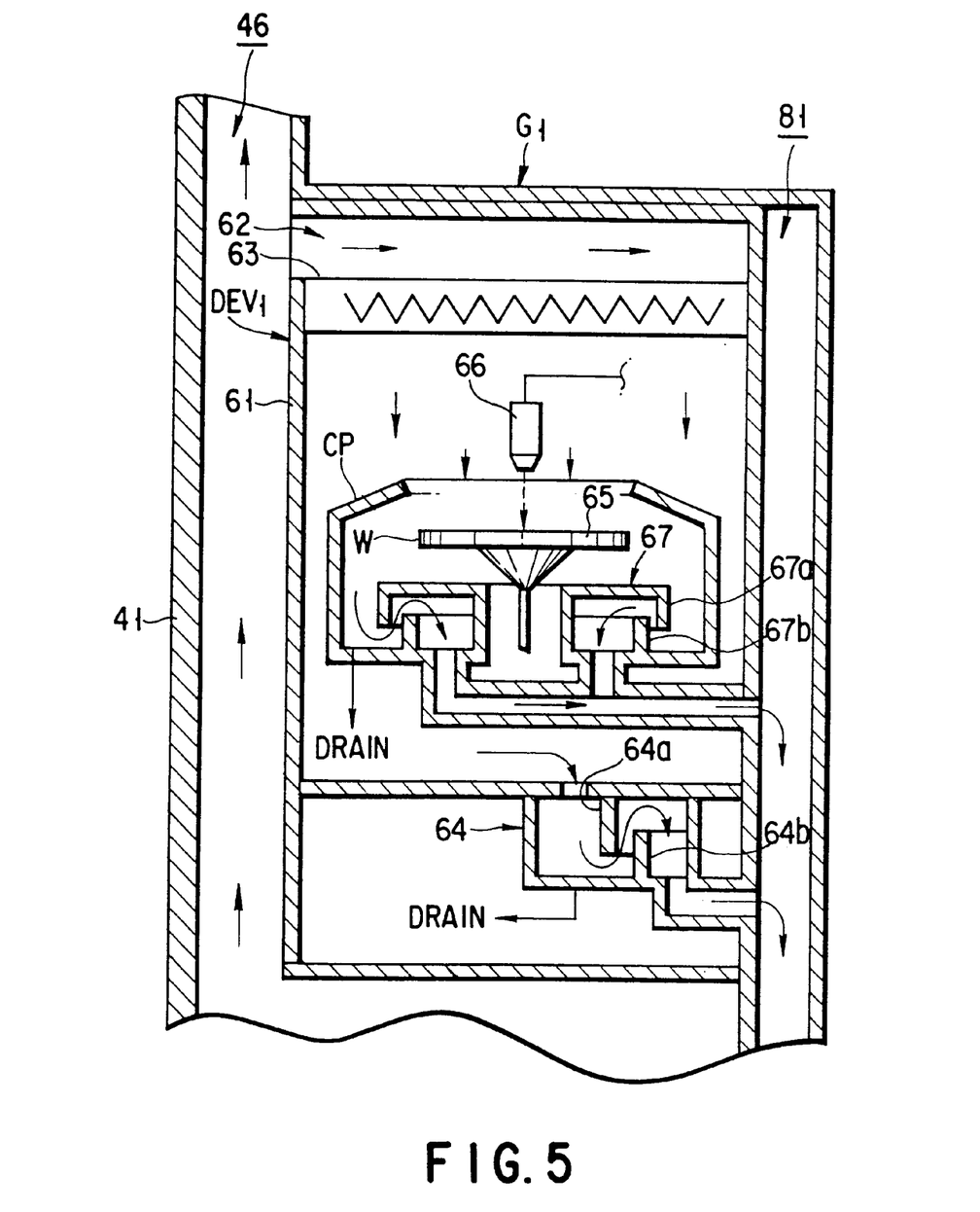
FIG. 5 is a schematic cross sectional view showing the inside of the resist coating apparatus according to an embodiment of the present invention.

A separator 64 serving as gas-liquid separator means is provided underneath the casing 61. The separator 64, as can be seen in FIG. 5, exhibits a so-called labyrinth structure made of a dropping wall 64a and a standing-up wall 64b, and has a gas-liquid separation function, which is achieved by inertial collusion. The atmosphere within the casing 61 is sent out to the exhaust pipe 81 provided separately, and then introduced to the filter mechanism 101 via a feeder pipe 50, after liquids including the developer solution are extracted from the atmosphere by the separator 64.

The processing chamber CP is situated in the casing 61, and in the processing chamber CP, a spin chuck 65 for holding a wafer W is provided. Onto the wafer W held by the spin chuck 65, a developer solution is supplied from a nozzle 66 which is a movable solution supply mechanism. Further, a separator 67 is provided in the bottom portion of the processing chamber CP. The separator 67, as can be seen in FIG. 5, includes a dropping wall 67a and a standing-up wall 67b, and has a gas-liquid separation function, which is achieved by inertial collusion. The atmosphere within the processing chamber CP is sent out to the exhaust pipe 81, after liquids including the developer solution are extracted from the atmosphere by the separator 67.

The liquids such as developer solutions separated from the exhaust atmosphere by the separators 64 and 67 are guided to a factory effluent system (not shown) via a separate liquid waste pipe (not shown).

As shown in FIG. 4, the exhaust and effluent systems for the resist solution coating unit $COT_1$ are similar in structure to those of the developer unit $DEV_1$. More specifically, a sub-chamber 72 is formed at an upper section of the inner side of the casing 71. The sub-chamber 72 is made to communicate to the wall duct 46 of the system. Therefore, the already cleaned air which flows through the wall duct 46 is discharged into the casing 71 as a down-flow, via the high-performance filter 73 provided underneath the sub-chamber 72. Alternatively, it is possible to constitute a structure in which the down-flow of air is introduced from the ceiling chamber 47 into the casing 71 without preparing a sub-chamber 72.

A separator 74 having a gas-liquid separation function, which is achieved by inertial collusion, is provided underneath the casing 71, as in the case of the separator 64 of the developer unit $DEV_1$. In similar to the case of the casing 61, the atmosphere within the casing 71 is sent out to the exhaust pipe 81, and then introduced to the filter mechanism 101 via a feeder pipe 50, after liquids including the developer solution are extracted from the atmosphere by the separator 74.

The processing chamber CP is situated in the casing 71, and in the processing chamber CP, a spin chuck 75 for holding a wafer W is provided. Onto the wafer W held by the spin chuck 75, a resist solution is supplied from a nozzle 76 which is a movable solution supply mechanism. Further, a separator 77 is provided in the bottom portion of the processing chamber CP. The separator 77, as in the case of the separator 67 of the developer unit $DEV_1$, has a gas-liquid separation function, which is achieved by inertial collusion. The atmosphere within the processing chamber CP is sent out to the exhaust pipe 81, after liquids including the resist solution are extracted from the atmosphere by the separator 77. The liquids such as developer solutions separated from the exhaust atmosphere by the separators 74 and 77 are guided to a factory effluent system (not shown) via a separate liquid waste pipe (not shown).

Figure 6:
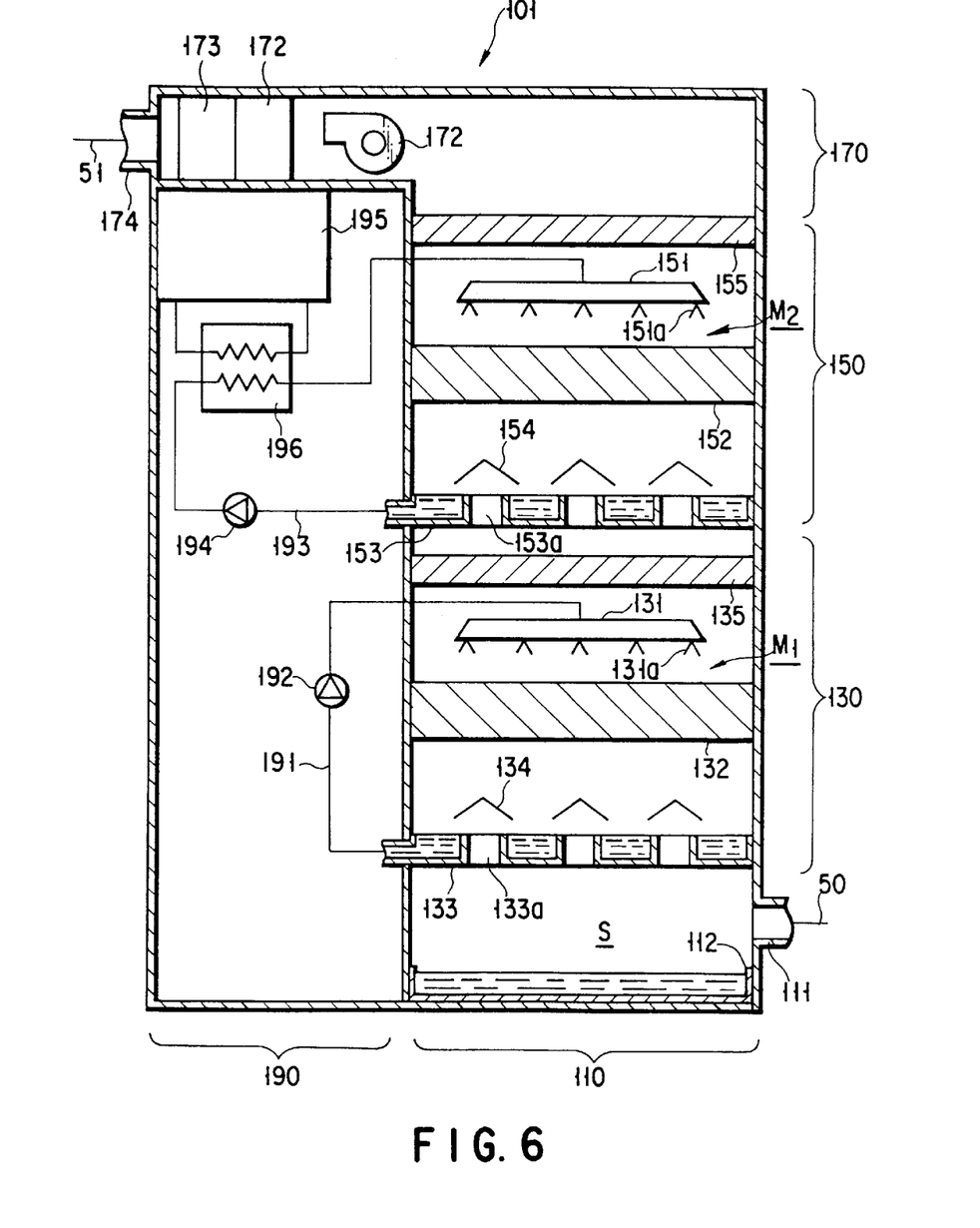
FIG. 6 is a schematic cross sectional view showing the inside of a filter mechanism used in the resist solution coating apparatus shown in FIG. 5.

Next, the structure of the filter mechanism 101 will now be described in detail. As shown in FIG. 6, the filter mechanism 101 consists mainly of an introduction unit 110, the first impurity remover unit 130, the second impurity remover unit, a guide-out unit 170 and an impurity remover solution circulating unit 190.

With the above-described structure, the air collected from the developer unit $DEV_1$ and the resist solution coating unit $COT_1$ is introduced to the space S from an introduction opening 111 made in the introduction unit 110, via the introduction pipe 50, together with the atmosphere in the space P in the coating/application processing system 1. At the lowermost portion of the introduction unit 110, a drain pan 112 for reserving part of an impurity remover liquid such as pure water, used in the first impurity remover unit 130 and the second impurity remover unit 150, is provided. It should be noted that the following description will be made in connection with the case where pure water is used as the impurity remover liquid.

The first impurity remover unit 130 has a spray unit 131 having a spray nozzle 131a, for spraying pure water in a form of fine mist, into a gas-liquid contact space $M_1$. Underneath the gas-liquid contact space $M_1$, a mist capture unit 132 made of nonwoven fabric which uniformly drops pure water sprayed from the spraying nozzle 131a by dispersing the water while trapping it.

Underneath the mist capture unit 132, a pan 133 for collecting pure water dripping from the mist capture unit 132, is provided. A ventilation pipe 133a is provided in the pan 133 in the up-and-down direction so as to guide the air ascending from the space S to the mist capture unit 132 and a gas-air contact space $M_1$. The ventilation pipe 133a has an additional function of guiding pure water over-flown from the pan 133 to the drain pan 112.

Between the mist capture unit 132 and the pan 133, a cap 134 formed to have a shape of, for example, an umbrella is provided such that pure water from the mist capture unit 132 does not directly drip on the drain pan 112. The cap 134 is installed directly above the ventilation pipe 133a for avoiding the direct dripping of pure water, and in order to allow air to pass, an appropriate gap is created. At the uppermost section of the first impurity remover unit 130, a de-mister (mist remover unit) 135 is provided so as to remove the mist in the air, which has passed through the gas-liquid contact space $M_1$.

The second impurity remover unit 150 is provided above the first impurity remover unit 130, and has basically a similar structure to that of the first impurity remover unit 130. That is, a pan 153 with a built-in ventilation pipe 153a is provided at the lowermost section of the unit, and a cap 154 is placed above the ventilation pipe 153a. In the gas-liquid contact space $M_2$ situated above the cap 154, a mist capture unit 152 and a spray unit 151 including a spray nozzle 151a are provided. A de-mister 155 is provided at the uppermost section of the second impurity remover unit 150.

In this embodiment, the first impurity remover unit 130 and the second impurity remover unit 130 are arranged one above another in two levels as shown in FIG. 6. With this structure, of the entire pure water used in the second impurity remover unit 150 situated in an upper level, and then collected in the pan 153, the over-flown portion can be supplied to the first impurity remover unit 150 located at a lower level. Therefore, it is not necessary to supply new pure water to the first impurity remover unit 130 located at a lower level, and thus the saving of pure water can be achieved.

The air from which the impurities have been removed by the first and second impurity remover units 130 and 150 is led to an air blowing fan 171 situated in the guide-out unit 170, and guided out towards a heating mechanism 172 and a humidifying mechanism 173. The heating mechanism 172 includes a mechanism for heating the air blown out by the air blowing fan 171, up to a predetermined temperature. The humidifying mechanism 173 includes a mechanism for humidifying the air heated to the predetermined temperature by the heating mechanism 173, up to a predetermined humidity. The temperature and humidity of the air are adjusted by the heating mechanism 172 and the humidifying mechanism 173 to be predetermined temperature and humidity, for example, a temperature of 23° C. and a relative humidity of 40%, and then such air is a guide-out exit 174 to the coating/development processing system 1. It should be noted that the heating mechanism 172 and the humidifying mechanism 173 are controlled by a separate control unit (not shown) and thus it is possible to blow air having arbitrarily set temperature and humidity.

In the case where the amount of air introduced to the filter unit 101 is not sufficient, the amount of air returned to the coating/development processing system 1 becomes short. In order to avoid this, it is possible that a necessary air introduction pipe is provided so as to introduce relatively clean air of, for example, the clean room in which the coating/development processing system 1 is installed, to the filter unit 101, where the air is mixed with the air cleaned by the filter unit 101, and then guided out to the coating/development processing system 1.

In the impurity remover solution circulating unit 190, a circulating system is provided so as to circulate pure water portions collected in the pan 133 of the first impurity remover unit 130 and the pan 153 of the second impurity remover unit 150, respectively to the spraying units 131 and 151. A circulation pipe 191 is equipped with a pump 192, and the pure water portion collected in the pan 133 is sent to the spraying unit 131 by the pump 192 to be sprayed. The pure water portion in the pan 153 is sent by pressure to the spraying unit 151 using the pump 194 provided on the circulation pipe 193, via a heat exchanger 196 for exchanging heat between the coolant of a refrigerator 195 and the pure water itself. With the heat exchanger 196, the temperature of the pure water can be adjusted to an appropriate one.

The coating/development processing system 1 equipped with the resist solution coating units $COT_1$ and $COT_2$ and the developer units $DEV_1$ and $DEV_2$, according to this embodiment has the above-described structure. The operation using the above-described structure will now be described.

First, the wafer transfer arm 21 accesses to a cassette C on the cassette table 20, and picks up one unprocessed wafer W from the cassette C. Then, the wafer transfer arm 21 moves to the alignment unit ALIM situated in the multi-level structure of the third processing unit group G3 on the processing station 11 side, and load the unprocessed wafer W in the alignment unit ALIM.

When the orientation flat alignment and centering of the wafer W are finished in the alignment unit ALIM, the main wafer transfer machine 22 receives the wafer W which has been aligned, and moves to the front of the adhesion unit AD located in the lower level to the alignment unit ALIM, so as to load the wafer W to the unit. Subsequently, the wafer W is loaded to the cooling unit belonging to the multi-level structure of the third processing unit group $G_3$ or the fourth processing unit group $G_4$. The wafer W is cooled down in the cooling unit COL to a preset temperature prior to the resist coating process, for example, 23° C.

The wafer W which has been cooled down is unloaded from the cooling unit COL by the main wafer transfer machine 22, and then loaded to the resist solution coating unit $COT_1$ which belongs to the multi-level structure of the first processing unit group $G_1$. In the resist solution coating unit $COT_1$, a resist film having a uniform thickness is formed on the surface of the wafer W by the spin coating method. It should be noted that in the second processing unit group $G_2$, the resist solution coating unit $COT_2$ having the same function as that the resist solution coating unit $COT_1$, is provided, and it is possible to carry out a resist processing on a wafer W in the resist solution coating unit $COT_2$.

The wafer W already subjected to the resist coating process is unloaded from the resist solution coating unit $COT_1$ by the main wafer transfer machine 22, and then transferred to other processing units, where respective processes are carried out. Subsequently, the wafer W is subjected to an exposure process in an exposure processing unit (not shown) located adjacent to the coating/development processing system 1, and then loaded into the development processing unit $DEV_1$ belonging to the multi-level structure of the first processing unit group G1 by the main wafer transfer machine 22. In the developer unit $DEV_1$, the wafer W is placed on the spin chuck and a developer solution is supplied uniformly onto the resist film on the surface of the wafer. When the removal of the resist from the peripheral portion of the wafer subjected to an development and peripheral exposure, is completed, a rinse solution is supplied onto the surface of the wafer so as to wash off the developer solution. It should be noted that in the second processing unit group $G_2$, the developer unit $DEV_2$ having the same function as that the developer unit $DEV_1$, is provided, and it is possible to carry out a development on a wafer W in the developer unit $DEV_2$.

When the development step is finished, the wafer W is unloaded from the developer unit DEV$_1$ by the main wafer transfer machine 22, and transferred to the other processing units, where respective processes are carried out on the wafer W one after another. After all the predetermined processes for the wafer W are completed, it is stored in a cassette C for storing processed wafers, located on the table 20, by the wafer transfer arm 21.

The atmosphere in the casing 61 of the developer unit DEV$_1$ and the atmosphere in the casing 71 of the resist solution coating unit COT$_1$ are introduced to the filter unit 101 via the exhaust pipe 81 and the introduction pipe 50, and in the filter unit 101, these gases are cleaned by gas-liquid contact and the temperature and moisture thereof are adjusted. Then, the mixture air is sent out to the wall duct 46 in the coating/development processing system 1. The air sent out to the wall duct 46 is discharged as a down-flow of air into the casings 61 and 71 via the sub-chambers 62 and 72 communicating to the wall duct 46, and the high-performance filters 63 and 73 respectively provided underneath. With this structure, the atmospheres in the casings 61 and 71 are recycled in the circulation without being discarded to the exhaust system of the factory. Consequently, the load on the factory exhaust system can be reduced, and therefore the cost for collecting the exhaust can be decreased. Further, the amount of new air supplied to the coating/development processing system 1, can be saved.

The separator 64 is provided at the lower portion within the casing 61, and the separator 67 is situated at the bottom portion of the processing chamber CP in the casing 61. Therefore, even if a great amount of developer solution is contained in the atmosphere in the casing 61, the atmosphere can be separated into gas and liquid by the separators 64 and 67, and therefore it is possible to introduce air containing little liquid component such as of the developer solution, to the filter unit 101. Similarly, the separator 74 is provided at the lower portion within the casing 71, and the separator 77 is situated at the bottom portion of the processing chamber CP in the casing 71. Therefore, even if a great amount of resist solution is contained in the atmosphere in the casing 71, the atmosphere can be separated into gas and liquid by the separators 74 and 77, and therefore it is possible to introduce air containing little liquid component such as of the resist solution, to the filter unit 101. Thus, the load on the filter unit 101 is reduced, and the impurity removing process by gas-liquid contact can be performed at a high efficiency.

The atmospheres exhausted from the resist solution coating unit COT$_1$ and the developer unit DEV$_1$ are blown out directly to the outside of the coating/development system 1 via the exhaust pipe 81, and therefore the clean down-flow formed within the coating/development processing system 1 is not disturbed.

Figure 7:
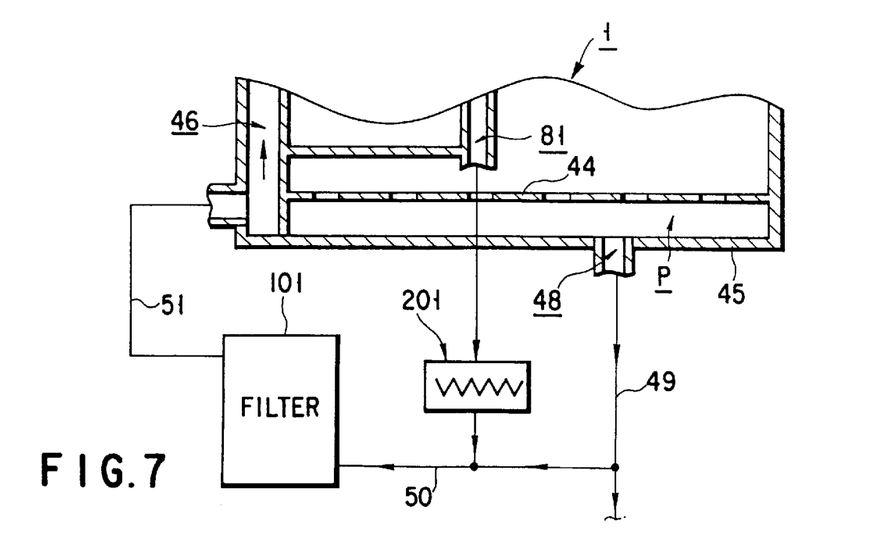
FIG. 7 is an explanatory diagram showing a piping system of a pre-filter mechanism used in the resist solution coating apparatus shown in FIG. 5.

Before the atmospheres exhausted from the resist solution coating unit COT$_1$ and the developer unit DEV$_1$ are introduced to the filter unit 101, they may be subjected again to the gas-liquid separation. More specifically, as can be seen in FIG. 7, a pre-filter mechanism 201 may be provided between the exhaust pipe 81 for blowing out the atmospheres within the resist solution coating unit COT$_1$ and the developer unit DEV$_1$ to the outside of the coating/development processing system 1, and the introduction pipe 50 connected to the filter unit 101. The pre-filter device 201 may be made of nonwoven cloth, or may have a structure in which a plurality of fins for removing liquid components by inertial collision are alternately arranged.

With use of the pre-filter mechanism 201, the liquid components contained in the atmospheres within the resist solution coating unit COT$_1$ and the developer unit DEV$_1$ which are blown out via the exhaust pipe 81, can be fully removed, and therefore the load on the filter unit 101 from then onwards can be further reduced, thus making it possible to further improve the impurity removing efficiency. Consequently, the maintenance cycle of the filter unit 101 can be prolonged, and the atmosphere within the coating/development processing system 1 can be maintained in a clean and proper temperature and humidity circumstance for a long period of time.

The solution processing device according to the above-described embodiment is described as a device for carrying out a resist solution coating process or a development process on a wafer W. The present invention, however, is not limited to such an embodiment, but can be applied to a spinner washing unit or the like. Further, the substrate is not limited to a semiconductor wafer, but may be an LCD substrate or a CD substrate.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

It is claimed:

1. A processing apparatus using solution comprising:
   a casing in which at least one processing chamber is provided;
   a rotary table which rotates while holding a substrate thereon, in the processing chamber provided in said casing;
   a supply mechanism for supplying a processing solution to a surface of the substrate held on said rotary table;
   a gas-liquid separation mechanism, provided in an exhaustion system for exhausting the casing, for separating liquid in an exhaust from gas; and
   an impurity remover unit, coupled to said casing, for cleaning unclean gas in said casing;
   wherein said impurity remover unit further comprises:
      a gas inlet opening connected to a gas exit of said gas-liquid separation mechanism;
      a cleaning unit for cleaning an object gas introduced from said inlet opening by bringing it into contact with an impurity remover solution; and
      supplying means for supplying thus cleaned gas into said casing.

2. A processing apparatus using solution comprising:
   a casing in which at least one processing chamber is provided;
   a rotary table which rotates while holding a substrate thereon, in the processing chamber provided in said casing;
   a supply mechanism for supplying a processing solution to a surface of the substrate held on said rotary table;
   a gas-liquid separation mechanism, provided in an exhaust system for exhausting the casing, for separating liquid in an exhaust from gas; and
   an impurity remover unit, coupled to said casing, for cleaning unclean gas in said casing;
   wherein said impurity remover unit further comprises:
      a gas inlet opening connected to a gas exit of said gas-liquid separation mechanism;
      a cleaning unit for cleaning an object gas introduced from said inlet opening by bringing it into contact with an impurity remover solution;

a temperature/humidity adjusting unit for adjusting a temperature and a humidity of the cleaned gas; and supplying means for supplying thus cleaned gas into said casing.

3. The processing apparatus according to claim 2, wherein said impurity remover unit has an exit connected to a supply system for introducing the cleaned gas having passed through said temperature/humidity adjusting unit into said processing chamber.

4. The processing apparatus according to claim 3, further comprising another gas-liquid separation mechanism in a connection system between the gas exit of said liquid-gas separation mechanism and the inlet opening of said impurity remover unit.

5. The processing apparatus according to claim 2, wherein said gas-liquid separation mechanism has a labyrinth structure made of a dropping wall and a standing-up wall.

6. The processing apparatus according to claim 2, further comprising another gas-liquid separation mechanism in a connection system between the gas exit of said liquid-gas separation mechanism and the inlet opening of said impurity remover unit.

7. The processing apparatus according to claim 6, wherein said another gas-liquid separation mechanism has a labyrinth structure made of a dropping wall and a standing-up wall.

8. The processing apparatus according to claim 2, further comprising a pre-filter unit in an upstream side of said impurity remover unit.

9. The processing apparatus according to claim 8, wherein said pre-filter unit is made of nonwoven cloth.

10. The processing apparatus according to claim 8, wherein said pre-filter unit has a function of removing a liquid component from a gas by subjecting the gas to inertial collision.

11. The processing apparatus according to claim 2, further comprising a sub-chamber at an upper section within said casing.

12. The processing apparatus according to claim 11, further comprising a high-performance filter at a lower section within said casing.

13. The processing apparatus according to claim 11, further comprising a wall duct for introducing air to said sub-chamber.

14. The processing apparatus according to claim 2, wherein said temperature/humidity adjusting unit adjust a temperature and a humidity of the gas having passed through said cleaning unit.

15. The processing method using solution comprising the steps of:

supplying a processing solution onto a surface of a substrate being rotated while holding the substrate in a processing chamber provided in a casing;

separating liquid and gas of an exhaust in said casing;

cleaning the separated gas by bringing it into contact with an impurity remover solution; and returning the cleaned gas into said casing.

16. The processing method according to claim 15, further comprising the step of adjusting a temperature and a humidity of the cleaned gas before returning the cleaned gas into said casing.

17. A processing method using solution comprising the steps of:

supplying a processing solution onto a surface of a substrate being rotated while holding the substrate in a processing chamber provided in a casing;

separating liquid and gas of an exhaust in said casing;

cleaning the separated gas by bringing it into contact with an impurity remover solution;

adjusting a temperature and a humidity of the cleaned gas; and returning the cleaned gas whose temperature and humidity adjusted, into said casing.

\* \* \* \* \*